United States Patent
Anderson et al.

(10) Patent No.: US 8,039,929 B2
(45) Date of Patent: Oct. 18, 2011

(54) ASYMMETRICALLY STRESSED CMOS FINFET

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 730 days.

(21) Appl. No.: 12/122,788

(22) Filed: May 19, 2008

(65) Prior Publication Data

US 2008/0217692 A1  Sep. 11, 2008

Related U.S. Application Data

(62) Division of application No. 11/162,660, filed on Sep. 19, 2005, now Pat. No. 7,400,031.

(51) Int. Cl.
*H01L 23/58* (2006.01)
*H01L 21/70* (2006.01)

(52) U.S. Cl. ............. 257/649; 257/369; 257/E27.062; 438/154; 438/791

(58) Field of Classification Search .................. None
See application file for complete search history.

(56) References Cited

U.S. PATENT DOCUMENTS

| | | | |
|---|---|---|---|
| 6,800,910 B2 | 10/2004 | Lin et al. | |
| 2003/0113970 A1* | 6/2003 | Fried et al. | 438/286 |
| 2003/0201458 A1 | 10/2003 | Clark et al. | |
| 2004/0029323 A1* | 2/2004 | Shimizu et al. | 438/142 |
| 2004/0126975 A1 | 7/2004 | Ahmed et al. | |
| 2004/0155271 A1 | 8/2004 | Mikata et al. | |
| 2004/0169239 A1 | 9/2004 | Rim | |
| 2004/0195627 A1 | 10/2004 | Dakshina-Murthy et al. | |
| 2004/0198031 A1 | 10/2004 | Lin et al. | |
| 2006/0014338 A1* | 1/2006 | Doris et al. | 438/197 |
| 2006/0113605 A1* | 6/2006 | Currie | 257/368 |
| 2006/0157687 A1 | 7/2006 | Doyle et al. | |
| 2007/0015347 A1 | 1/2007 | Mehta et al. | |

* cited by examiner

*Primary Examiner* — Hoang-Quan Ho
(74) *Attorney, Agent, or Firm* — Gibb I.P. Law Firm, LLC; Richard M. Kotulak, Esq.

(57) ABSTRACT

A CMOS device comprising a FinFET comprises at least one fin structure comprising a source region; a drain region; and a channel region comprising silicon separating the source region from the drain region. The FinFET further comprises a gate region comprising a N+ polysilicon layer on one side of the channel region and a P+ polysilicon layer on an opposite side of the channel region, thereby, partitioning the fin structure into a first side and a second side, respectively. The channel region is in mechanical tension on the first side and in mechanical compression on the second side. The FinFET may comprise any of a nFET and a pFET, wherein the nFET comprises a N-channel inversion region in the first side, and wherein the pFET comprises a P-channel inversion region in the second side. The CMOS device may further comprise a tensile film and a relaxed film on opposite sides of the fin structure adjacent to the source and drain regions, and an oxide cap layer over the fin structure.

20 Claims, 7 Drawing Sheets

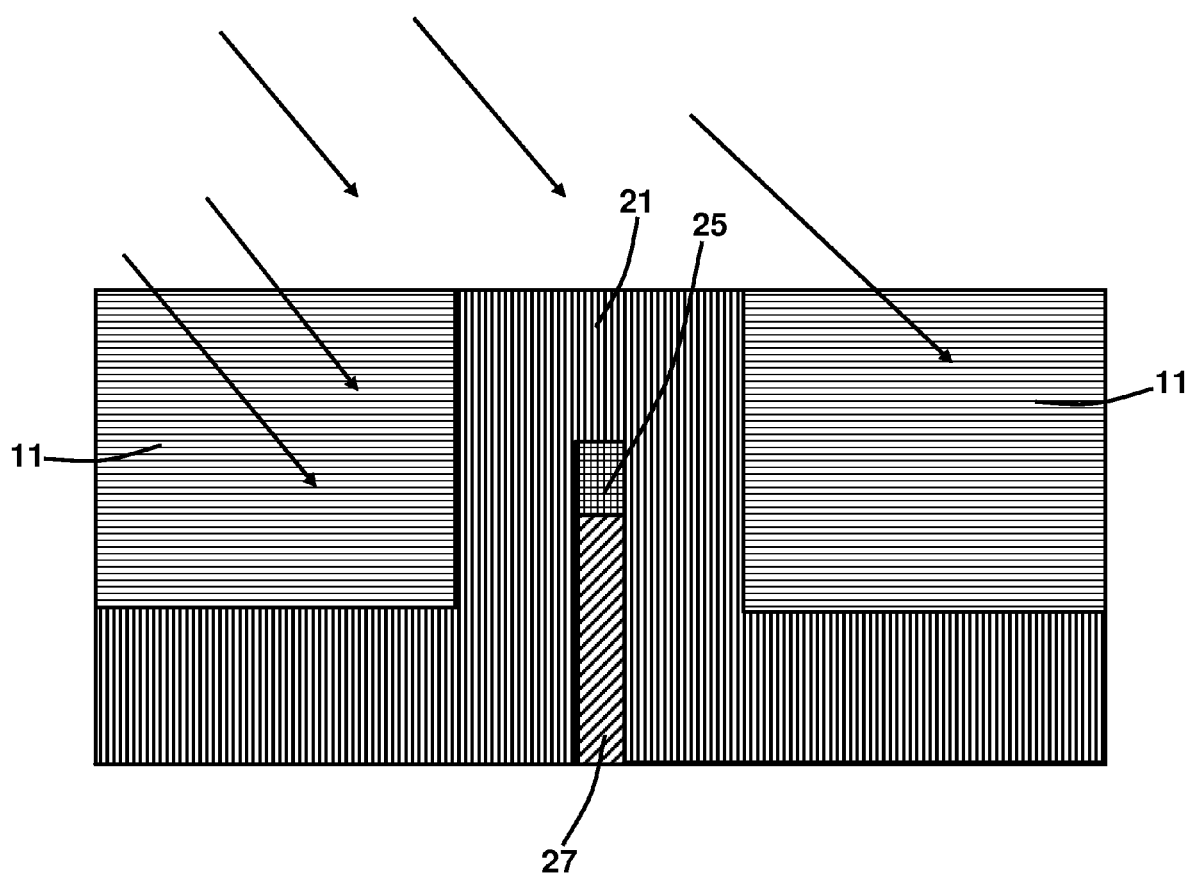

ASYMMETRICALLY STRESSED CMOS FINFET

CROSS-REFERENCE TO RELATED APPLICATIONS

This application is a division of U.S. application Ser. No. 11/162,660 filed Sep. 19, 2005, the complete disclosure of which, in its entirety, is herein incorporated by reference.

BACKGROUND

1. Field of the Invention

The embodiments of the invention generally relate to complementary metal oxide semiconductor (CMOS) devices, and, more particularly, to a field effect transistor (FET) used in a CMOS device.

2. Description of the Related Art

In FET devices, hole mobility is augmented when the channel is under compression in a direction parallel to the current. Electron mobility is augmented when the channel is under tension in a direction parallel to the current. Thus, there is the complication of the need to supply oppositely stressed materials for pFETs and nFETs if the switching speed is to be optimal for both simultaneously. Conventional CMOS devices typically involve either favorably straining only pFETs or nFETs while relieving the strain on the opposite type, or be depositing separate straining films for each type of FET, which is generally costly and complicated to fabricate. Therefore, there remains a need for a novel CMOS device that has oppositely stressed materials for pFETs and nFETs.

SUMMARY

In view of the foregoing, an embodiment of the invention provides a complementary metal oxide semiconductor (CMOS) device comprising a fin field effect transistor (FinFET) comprises at least one fin structure comprising a source region; a drain region; and a channel region separating the source region from the drain region. The FinFET further comprises a gate region partitioning the fin structure into a first side and a second side, wherein the channel region is in mechanical tension on the first side of the fin structure, and wherein the channel region is in mechanical compression on the second side of the fin structure. In one embodiment, the FinFET may comprise any of a nFET and a pFET, wherein the nFET comprises a N-channel inversion region in the first side of the fin structure. Moreover, in another embodiment, the FinFET may comprise any of a nFET and a pFET, wherein the pFET comprises a P-channel inversion region in the second side of the fin structure. Preferably, the channel region comprises silicon. Additionally, the CMOS device may further comprise a tensile film and a relaxed film on opposite sides of the fin structure. Furthermore, the CMOS device may comprise an oxide cap layer over the fin structure.

Another aspect of the invention provides a semiconductor structure comprising at least one fin structure comprising a source region; a drain region; and a channel region connected to the source and drain regions. The semiconductor structure further includes a gate region separating the fin structure into two sides. The gate region comprises a N+ polysilicon layer adjacent to the channel region on the first side of the fin and a P+ polysilicon layer adjacent to the channel region on the opposite side of the fin (i.e., on the second side). A tensile film is adjacent to the source and drain regions on the first side of the fin structure and a relaxed film is adjacent to the source and drain regions on the second side of the fin structure. In one embodiment, the semiconductor structure further comprises FinFET comprising any of a nFET and a pFET, wherein the nFET comprises a N-channel inversion region in the first side of the fin structure. In another embodiment, the semiconductor structure further comprises a FinFET comprising any of a nFET and a pFET, wherein the pFET comprises a P-channel inversion region in the second side of the fin structure. Preferably, the channel region comprises silicon. Additionally, the semiconductor structure preferably comprises an oxide cap layer over the fin structure.

Another embodiment of the invention provides a method of forming a CMOS device comprising a FinFET, wherein the method comprises forming at least one fin structure comprising forming a source region; forming a drain region; and forming a channel region separating the source region from the drain region. The method further includes configuring a gate region over the source region and the drain region, wherein the configuring comprises partitioning the fin structure into a first side and a second side, wherein the channel region is in mechanical tension on the first side of the fin structure, and wherein the channel region is in mechanical compression on the second side of the fin structure. In one embodiment the FinFET is formed of any of a nFET and a pFET, wherein in the nFET, the method may further comprise forming a N-channel inversion region in the first side of the fin structure.

In another embodiment, the FinFET is formed of any of a nFET and a pFET, wherein in the pFET, the method may further comprise forming a P-channel inversion region in the second side of the fin structure. Preferably, the channel region comprises silicon. The method may further comprise forming a tensile film and a relaxed film on opposite sides of the fin structure. Also, the method may further comprise forming an oxide cap layer over the fin structure. Moreover, the method may further comprise forming a first film comprising nitride and having tensile stress on one side of the fin structure; releasing the tensile stress by introducing an angle implant to the first film; and forming a second film comprising nitride and having compressive stress on an opposite side of the fin structure. Alternatively, the method may further comprise forming a first film comprising nitride and having a first type of stress on the fin structure; damaging nitride on the fin structure by introducing an angle implant to the fin structure; etching the damaged nitride; and forming a second film comprising nitride and having a second type of stress on the fin structure, wherein the first type of stress is mechanically opposite to the second type of stress.

These and other aspects of embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIGS. 4(A) through 4(D) illustrate sequential fabrication steps for manufacturing a CMOS device according to an embodiment of the invention.

DETAILED DESCRIPTION OF PREFERRED EMBODIMENTS OF THE INVENTION

Figure 1:
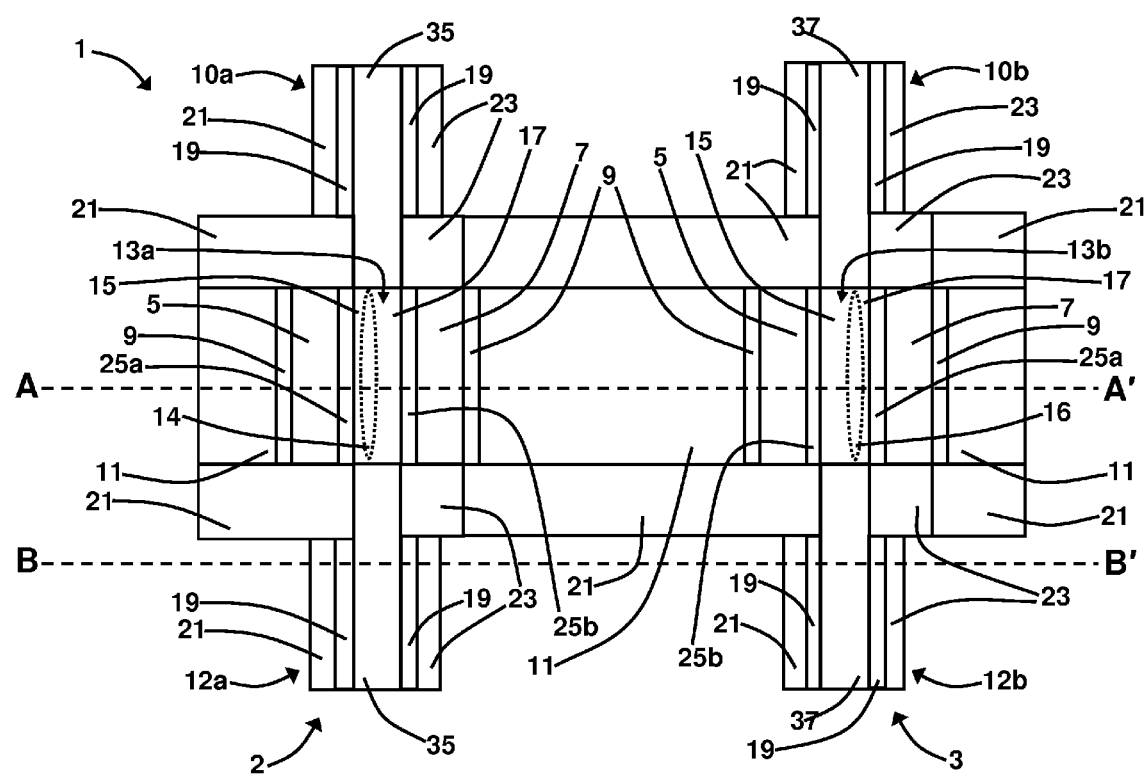
FIG. 1 illustrates a top view of a CMOS device according to an embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there is the complication of the need to supply oppositely stressed materials for pFETs and nFETs if switching speed is to be optimal for both simultaneously. Hence, there remains a need for a novel CMOS device that has oppositely stressed materials for pFETs and nFETs. The embodiments of the invention achieve this by providing a structure and process which is the same for pFETs and for nFETs and yet provides for the correct sense of stress/strain on each simultaneously. Referring now to the drawings, and more particularly to FIGS. 1 through 5, there are shown preferred embodiments of the invention.

FIG. 1 illustrates a CMOS device 1 according to an embodiment of the invention. The CMOS device 1 includes an nFET 2 and a pFET 3 configured on the same device 1. The nFET 2 comprises a N+ source region 12a and a N+ drain region 10a configured as fin devices of the nFET 2. Similarly, the pFET 3 comprises a P+ source region 12b and a P+ drain region 10b configured as fin devices of the pFET 3. For the nFET 2, each of the N+ source region 12a and N+ drain region 10a comprises a N+ silicon layer 35 having a metal silicide sidewall layer 19 surrounding the sidewalls of the N+ silicon layer 35. In the nFET 2, adjacent to the metal silicide sidewall layers 19 is a tensile nitride film 21 on a first side of the fin and adjacent to the metal silicide sidewall layer 19 on the opposite side of the fin (i.e., on a second side) is a relaxed nitride film 23.

For the pFET 3, each of the P+ source region 12b and P+ drain region 10b comprises a P+ silicon layer 37 having a metal silicide sidewall layer 19 surrounding the sidewalls of the P+ silicon layer 37. In the pFET 3, adjacent to the metal silicide sidewall layers 19 on a first side of the fin is a tensile nitride film 21 and adjacent to the metal silicide sidewall layer 19 on the opposite side of the fin (i.e., on a second side) is a relaxed nitride film 23.

In the nFET 2, separating the N+ source region 12a from the N+ drain region 10a is a channel region 13a. Positioned at the first side of the fin in the channel region 13a is a silicon layer 15 which is mechanically stressed such that it is in mechanical tension. Positioned at the second side of the fin in the channel region 13a is a silicon layer 17 which is mechanically stressed such that it is in mechanical compression. A N-channel inversion region 14 is in the side in tension (i.e., on the first side of the fin). The N-channel inversion region 14 is a region within the channel region 13a that extends from the interface at the gate dielectric layer 25a into the channel region 13a by approximately 1 nm. Here, a layer of electrons (not shown) that are responsible for conducting current from source 12b to drain 10b, forms when the gate voltage is above a threshold voltage. In the nFET 2, a gate dielectric layer 25a is formed on one side of the channel region 13a (i.e., on the first side of the fin) such that the gate dielectric layer 25a is adjacent to the silicon layer 15. A gate dielectric layer 25b is formed on the other side of the channel region 13b (i.e., on the second side of the fin) such that the gate dielectric layer 25b is adjacent to the silicon layer 17. The gate dielectric layers 25a, 25b are positioned on opposite sides of the channel region 13a. Next, adjacent to the gate dielectric layer 25a on the first side of the fin is a gate N+ polysilicon layer 5 and adjacent to the other gate dielectric layer 25b on the second side of the fin is a gate P+ polysilicon layer 7. A liner material 9 such as titanium nitride (TiN) is formed adjacent to the outer wall of the N+ polysilicon layer 5 and P+ polysilicon layer 7. A gate conductor 11 preferably comprising a conducting material such as metal or N+ polysilicon is formed adjacent to the liners 9.

Similarly, in the pFET 3, separating the P+ source region 12b from the P+ drain region 10b is a channel region 13b. Positioned at the first side of the fin in the channel region 13b is a silicon layer 15 which is mechanically stressed such that it is in mechanical tension. Positioned at the second side of the fin in the channel region 13a is a silicon layer 17 which is mechanically stressed such that it is in mechanical compression. A P-channel inversion region 16 is in the side in compression (i.e., on the second side of the fin) The P-channel inversion region 16 is a region within the channel region 13b that extends from the interface at the gate dielectric layer 25b into the channel region 13b by approximately 1 nm. Here, a layer of holes (not shown) that are responsible for conducting current from source 12b to drain 10b forms when the gate voltage is below a threshold voltage. In the pFET 3, a gate dielectric layer 25a is formed on one side of the channel region 13b (i.e., on the second side of the fin) such that the gate dielectric layer 25a is adjacent to the silicon layer 17. A gate dielectric layer 25b is formed on the other side of the channel region 13a (i.e., on the first side of the fin) such that the gate dielectric layer 25b is adjacent to the silicon layer 15. The gate dielectric layers 25a, 25b are positioned on opposite sides of the channel region 13b. Next, adjacent to the gate dielectric layer 25a (i.e., on the second side of the fin) is a P+ polysilicon layer 7 and adjacent to the other gate dielectric layer 25b (i.e., on the first side of the fin) is a N+ polysilicon layer 5. A liner material 9 such as titanium nitride (TiN) is formed adjacent to the outer wall of the N+ polysilicon layer 5 and P+ polysilicon layer 7. A gate conductor 11 preferably comprising a conducting material such as metal or N+ polysilicon is formed adjacent to the liners 9.

Figure 2:
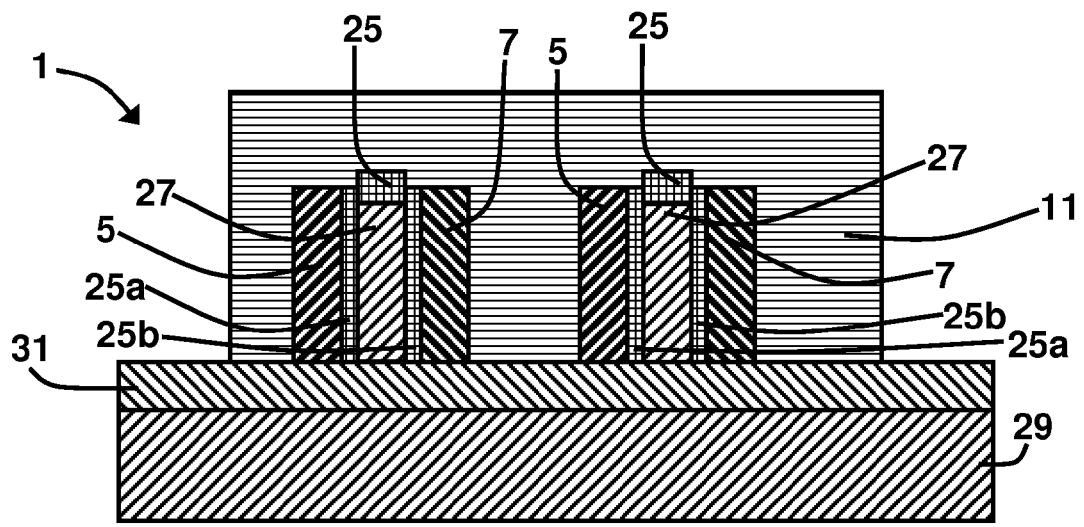
FIG. 2 illustrates a cross-sectional view of the CMOS device of FIG. 1 taken along line A-A' of FIG. 1 according to an embodiment of the invention.
Figure 3:
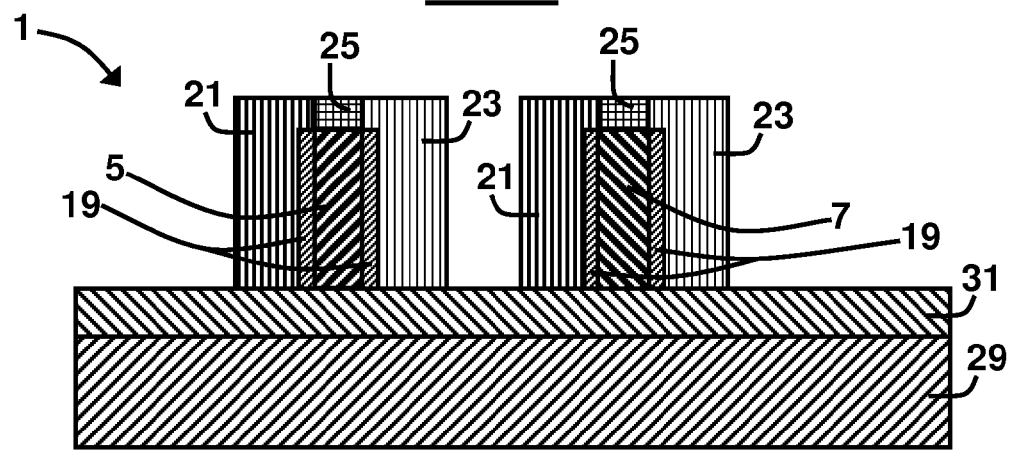
FIG. 3 illustrates a cross-sectional view of the CMOS device of FIG. 1 taken along line B-B' of FIG. 1 according to an embodiment of the invention.

FIG. 2 illustrates a cross-sectional view of the CMOS device 1 of FIG. 1 taken along line A-A' (through the gate region 11) of FIG. 1 and FIG. 3 illustrates a cross-sectional view of the CMOS device 1 of FIG. 1 taken along line B-B' (through the source regions 12a, 12b) of FIG. 1. As shown in FIGS. 2 and 3, the CMOS device 1 is formed on a buried oxide (BOX) layer 31 formed over a substrate 29. The fins 27 preferably comprise silicon and are capped with an oxide material 25.

Figure 4A:
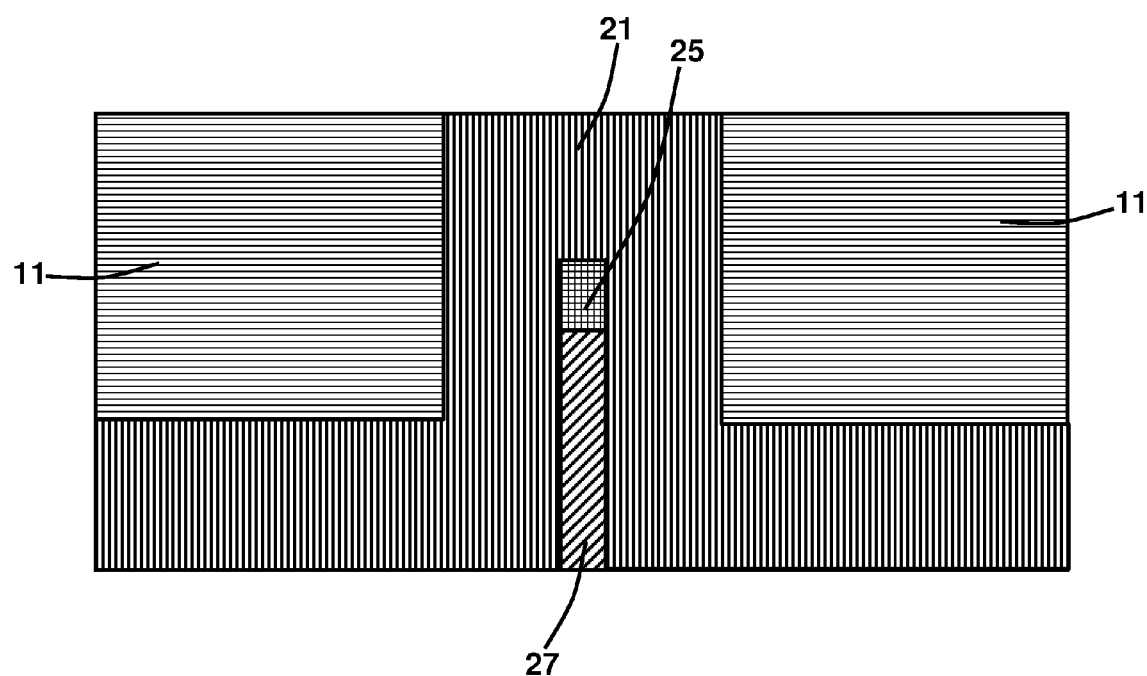
Figure 4C:
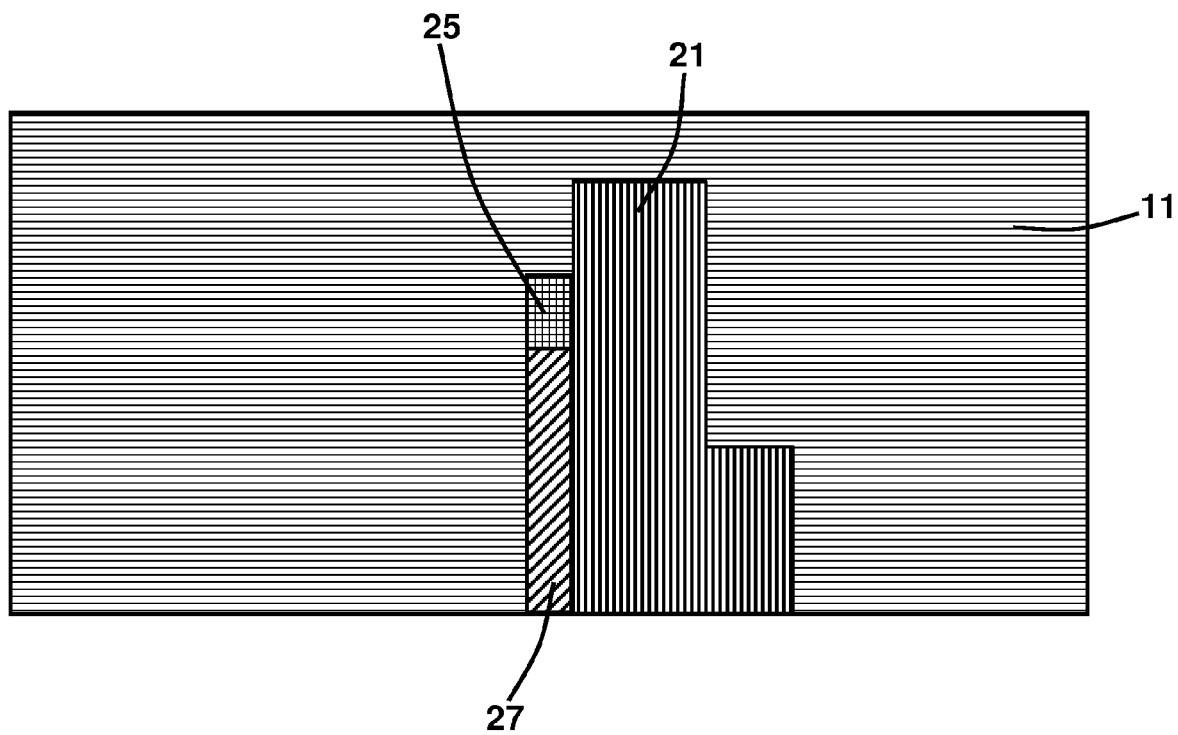
Figure 4D:
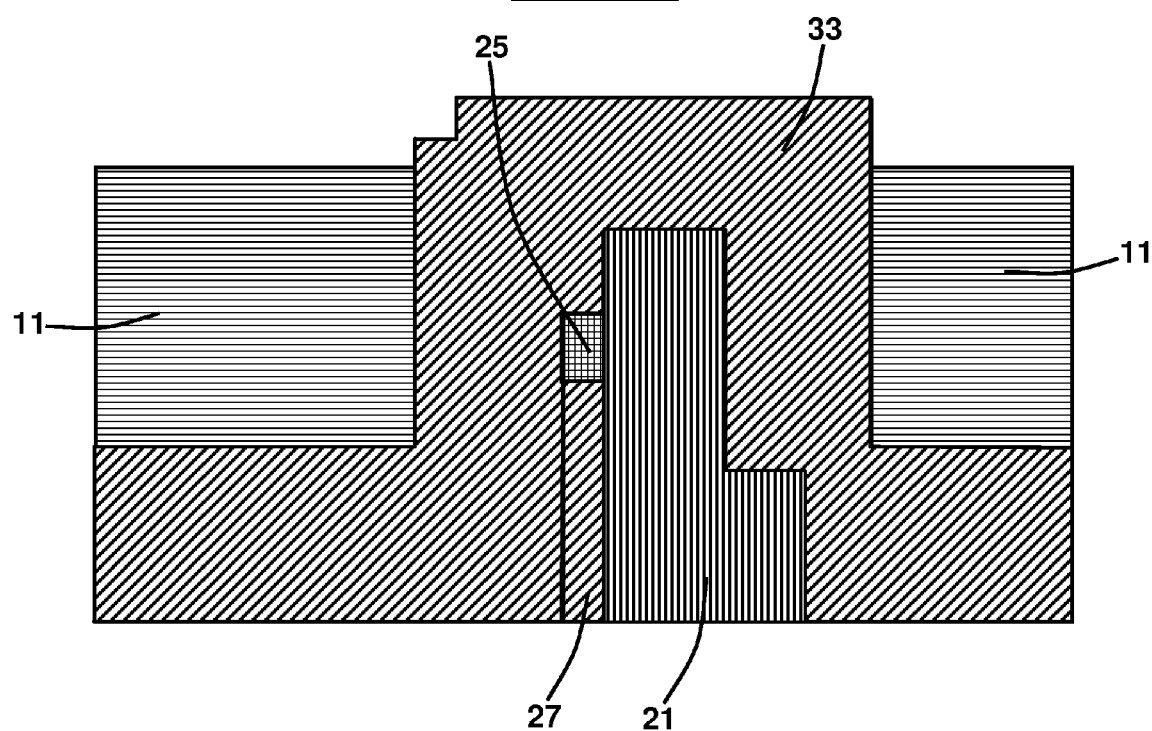

FIGS. 4(A) through 4(D) illustrate sequential fabrication steps for manufacturing a CMOS device according to an embodiment of the invention. First, as shown in FIG. 4(A), a tensile nitride film 21 is formed around the fin structure 27 (and oxide cap 25). Next, an ion implant of germanium or arsenic is performed as generally denoted by the angled arrows in FIG. 4(B). Thereafter, the tensile nitride film 21 is selectively etched using well-known etching techniques as depicted in FIG. 4(C). Finally, a compressive nitride layer 33 is formed around the fin structure 27 (and oxide cap 25) and tensile nitride film 21. The sign and magnitude of the strain of the nitride film 21 is dependent on deposition details, such as the percentage of hydrogen content, pressure, and temperature of the deposition chamber. Preferably, a plasma-enhanced chemical vapor deposition (PECVD) process is employed.

The embodiments of the invention use asymmetric-work-function gates 11 on FinFET devices 2, 3 together with a process which causes the fins 27 to "bend" inward so as to put the channel 13a, 13b under compression on one side and under tension on the opposite side of the fin 27. In a preferred embodiment, the gate electrodes 11 are formed of N+ and P+ polysilicon layers 5 and 7, respectively, and the fin 27 is strained so as to be under tension near to the N+ polysilicon layer 5 and under compression adjacent to the P+ polysilicon layer 7. Specifically, by providing for a film 21 under tension on the source and drain regions on the same side of the fins as the N+ polysilicon layer 5, differentially with respect to the stress in the relaxed film 23 on the source and drain regions on the opposing side, the forces upon the fin 27 result in a bending action, causing the fin 27 to slightly arch in a concave manner toward the P+ polysilicon layer 7. When the fin 27 is so arched, the surface of the fin 27 on the convex side will naturally be under tension, that is, the lattice spacing of silicon atoms on the side of the channel 13a with an N+ gate will have a physical separation slightly larger than that of unstrained silicon, while the opposite side of the fin 27 will be under compression, that is, the lattice spacing of the silicon atoms on the P+ side will be slightly less than that of unstrained silicon.

Figure 5:
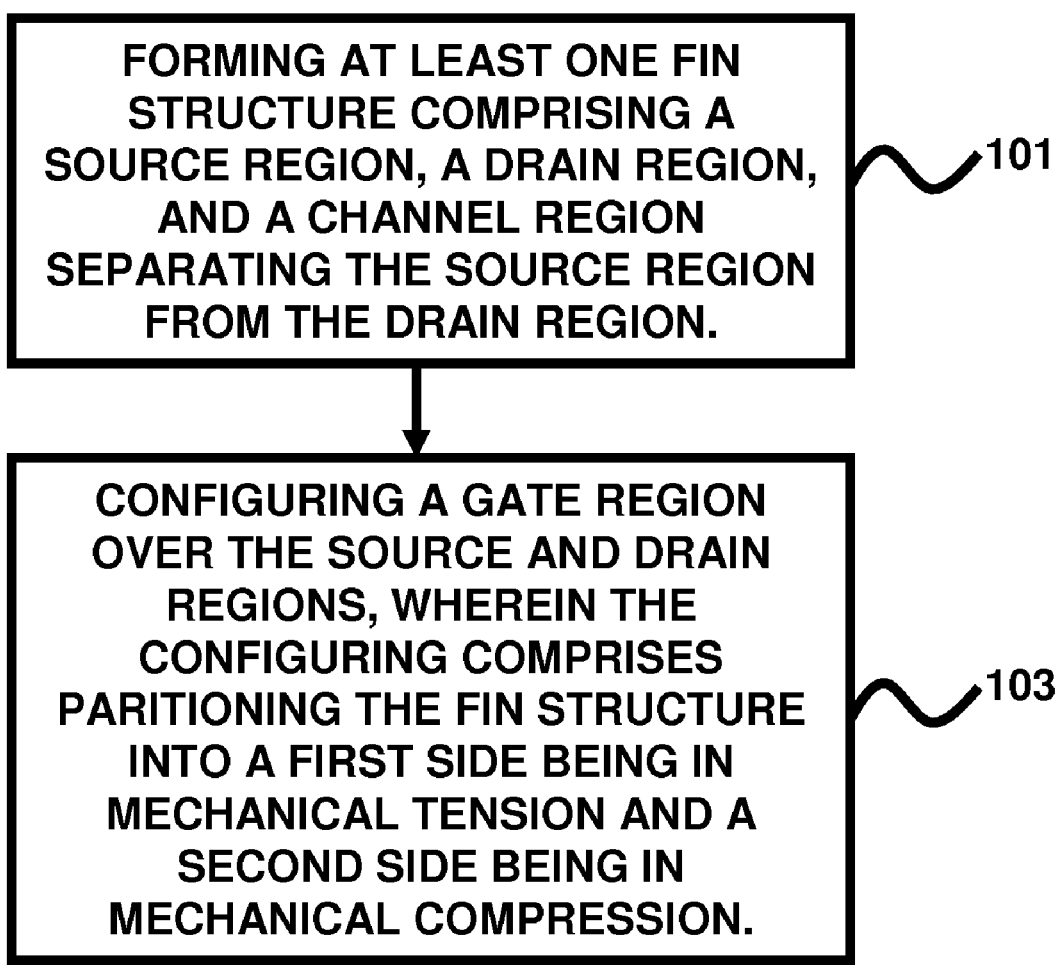
FIG. 5 is a flow diagram illustrating a preferred method according to an embodiment of the invention.

FIG. 5 (with reference to FIGS. 1 through 4(D)) is a flow diagram illustrating a method of forming a CMOS device 1 comprising a FinFET (shown collectively as nFET 2 and pFET 3), wherein the method comprises forming (101) at least one fin structure 27 comprising forming a source region 12a, 12b; forming a drain region 10a, 10b; and forming a channel region 13a, 13b separating the source region 12a, 12b from the drain region 10a, 10b, respectively. The method further includes configuring (103) a gate region 11 with a N+ polysilicon layer 5 adjacent one side of the channel region 13a, 13b and a P+ polysilicon layer 7 adjacent an opposite side of the channel region, thereby, partitioning the fin structure 27 into a first side 15 and a second side 17. As discussed above, the channel region 13a, 13b is in mechanical tension on the first side 15 of the fin structure 27, and the channel region 13a, 13b is in mechanical compression on the second side 17 of the fin structure 27.

In one embodiment the FinFET is formed of any of a nFET 2 and a pFET 3, wherein in the nFET 2, the method may further comprise forming a N-channel inversion region 14 in the first side 15 of the fin structure. In the pFET 3, the method may further comprise forming a P-channel inversion region 16 in the second side 17 of the fin structure 27. Preferably, the channel region 13a, 13b comprises silicon. The method may further comprise forming a tensile film 21 and a relaxed film 23 on opposite sides of the fin structure 27. Also, the method may further comprise forming an oxide cap layer 25 over the fin structure 27.

More specifically, the method may further comprise forming a first film 21 comprising nitride and having tensile stress on one side of the fin structure 27; releasing the tensile stress by introducing an angle implant to the first film 21; and forming a second film 33 comprising nitride and having compressive stress on an opposite side of the fin structure 27. Alternatively, the method may further comprise forming a first film 21 comprising nitride and having a first type of stress on the fin structure; damaging nitride on the fin structure 27 by introducing an angle implant to the fin structure 27; etching the damaged nitride; and forming a second film 33 comprising nitride and having a second type of stress on the fin structure 27, wherein the first type of stress is mechanically opposite to the second type of stress.

The several embodiments of the invention can be formed into integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention has been described in terms of preferred embodiments, those skilled in the art will recognize that the embodiments of the invention can be practiced with modification within the spirit and scope of the appended claims.

What is claimed is:

1. A complementary metal oxide semiconductor (CMOS) device comprising a fin field effect transistor (FinFET) comprising:

at least one fin structure having a first end, a second end, a center section positioned laterally between said first end and said second end, a first side and a second side opposite said first side, said fin structure comprising:
a source region at said first end;
a drain region at said second end; and
a channel region in said center section between said source region said drain region;
a gate structure adjacent to said channel region on said first side and on said second side of said fin structure,
said channel region having a first portion in mechanical compression adjacent to said gate structure at said first side of said fin structure and further having a second portion in mechanical tension adjacent to said gate structure at said second side of said fin structure.

2. The CMOS device of claim 1, said FinFET comprising an nFET and said nFET comprising an N-channel inversion region at said second side of said fin structure.

3. The CMOS device of claim 1, said FinFET comprising a pFET and said pFET comprising a P-channel inversion region at said first side of said fin structure.

4. The CMOS device of claim 1, said channel region comprising silicon.

5. The CMOS device of claim 1, further comprising a tensile film on said second side of said fin structure and a relaxed film on said first side of said fin structure opposite said tensile film.

6. The CMOS device of claim 1, further comprising an oxide cap layer over said fin structure.

7. A complementary metal oxide semiconductor (CMOS) device comprising a fin field effect transistor (FinFET) comprising:
   at least one fin structure having a first end, a second end, a center section positioned laterally between said first end and said second end, a first side and a second side opposite said first side, said fin structure comprising:
      a source region at said first end;
      a drain region at said second end; and
      a channel region in said center section between said source region from said drain region;
   a gate structure adjacent to said channel region on said first side and on said second side of said fin structure; and
   a relaxed film on said first side of said fin structure and a tensile film on said second side of said fin structure opposite said relaxed film such that said channel region has a first portion in mechanical compression adjacent to said gate structure at said first side of said fin structure and further has a second portion in mechanical tension adjacent to said gate structure at said second side of said fin structure.

8. The CMOS device of claim 7, said FinFET comprising an nFET and said nFET comprising an N-channel inversion region at said second side of said fin structure.

9. The CMOS device of claim 7, said FinFET comprising a pFET and said pFET comprising a P-channel inversion region at said first side of said fin structure.

10. The CMOS device of claim 7, said channel region comprising silicon.

11. The CMOS device of claim 7, said tensile film being adjacent to said source region and said drain region on said second side of said fin structure and said relaxed film being adjacent to said source region and said drain region on said first side of said fin structure.

12. The CMOS device of claim 7, further comprising an oxide cap layer over said fin structure.

13. A method of forming a complementary metal oxide semiconductor (CMOS) device comprising a fin field effect transistor (FinFET), said method comprising:
   forming at least one fin structure;
   forming a gate structure adjacent to a channel region of said fin structure such that said gate structure is positioned on a first side of said fin structure and on a second side of said fin structure opposite said first side; and
   forming differently strained films on said first side and said second side of said fin structure such that said channel region has a first portion in mechanical compression adjacent to said gate structure at said first side of said fin structure and further has second portion in mechanical tension adjacent to said gate structure at said second side of said fin structure.

14. The method of claim 13, said FinFET being formed as an nFET with an N-channel inversion region at said second side of said fin structure.

15. The method of claim 13, said FinFET being formed as a pFET with a P-channel inversion region at said first side of said fin structure.

16. The method of claim 13, said channel region comprising silicon.

17. The method of claim 13, said forming of said differently strained films comprising forming a tensile film on said second side of said fin structure and a relaxed film on said first side of said fin structure opposite said tensile film.

18. The method of claim 13, further comprising forming an oxide cap layer over said fin structure.

19. The method of claim 13, said forming of said differently strained films comprising:
   forming a first film comprising nitride and having tensile stress on said second side of said fin structure;
   releasing the tensile stress by introducing an angle implant to said first film; and
   forming a second film comprising nitride and having compressive stress on said first side of said fin structure.

20. The method of claim 13, said forming of said differently strained films comprising:
   forming a first film comprising nitride and having a first type of stress on said fin structure;
   damaging nitride on said fin structure by introducing an angle implant to said fin structure;
   etching the damaged nitride; and
   forming a second film comprising nitride and having a second type of stress on said fin structure,
   wherein said first type of stress is mechanically opposite to said second type of stress.

* * * * *